United States Patent
Sugisawa

(10) Patent No.: US 9,871,464 B2
(45) Date of Patent: Jan. 16, 2018

(54) GROUND STRUCTURE FOR CONTROL UNIT

(71) Applicant: Mitsubishi Electric Corporation, Tokyo (JP)

(72) Inventor: Kotaro Sugisawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/308,492

(22) PCT Filed: May 14, 2014

(86) PCT No.: PCT/JP2014/062885
§ 371 (c)(1),
(2) Date: Nov. 2, 2016

(87) PCT Pub. No.: WO2015/173919
PCT Pub. Date: Nov. 19, 2015

(65) Prior Publication Data
US 2017/0054382 A1 Feb. 23, 2017

(51) Int. Cl.
*H02M 7/04* (2006.01)
*H05K 1/02* (2006.01)
*H02M 7/00* (2006.01)

(52) U.S. Cl.
CPC ............ *H02M 7/04* (2013.01); *H02M 7/003* (2013.01); *H05K 1/02* (2013.01)

(58) Field of Classification Search
CPC ................................. H02M 7/04; H02M 7/003
See application file for complete search history.

(56) References Cited

U.S. PATENT DOCUMENTS 6,246,560 B1* 6/2001 Linares .................. G06F 1/182
361/119
7,249,895 B2* 7/2007 Diaz .................... G02B 6/4246
385/92

(Continued)

FOREIGN PATENT DOCUMENTS

| JP | 57-107300 U | 7/1982 |
| JP | 5-22985 A | 1/1993 |
| JP | 05-102676 A | 4/1993 |

(Continued)

OTHER PUBLICATIONS

International Search Report for PCT/JP2014/062885 dated Aug. 19, 2014.

(Continued)

*Primary Examiner* — Emily P Pham
(74) *Attorney, Agent, or Firm* — Sughrue Mion, PLLC; Richard C. Turner

(57) ABSTRACT

A control unit includes a power supply board on which a control power-supply circuit that generates a control voltage is mounted, a control board on which a control circuit that is operated based on the control voltage is mounted, and a connection medium that connects the power supply board and the control board to each other and is used to supply the control voltage from the control power-supply circuit to the control circuit. A signal ground of the control power-supply circuit and a signal ground of the control circuit are connected to each other via a frame ground without via the connection medium.

5 Claims, 6 Drawing Sheets

(56) References Cited

U.S. PATENT DOCUMENTS

| | | |
|---|---|---|
| 2004/0018758 A1 | 1/2004 | Yoshinaga et al. |
| 2016/0229362 A1* | 8/2016 | Brutus .................. B60R 16/033 |

FOREIGN PATENT DOCUMENTS

| | | |
|---|---|---|
| JP | 07-051457 A | 2/1995 |
| JP | 7-115787 A | 5/1995 |
| JP | 7-93761 B2 | 10/1995 |
| JP | 7-93762 B2 | 10/1995 |
| JP | 09-162594 A | 6/1997 |
| JP | 09-199818 A | 7/1997 |
| JP | 10-145013 A | 5/1998 |
| JP | 11-235081 A | 8/1999 |
| JP | 11-355091 A | 12/1999 |
| JP | 11-355909 A | 12/1999 |
| JP | 2001-286152 A | 10/2001 |
| JP | 2003-330378 A | 11/2003 |
| JP | 2004-055988 A | 2/2004 |
| JP | 2014-220383 A | 11/2014 |

OTHER PUBLICATIONS

Communication dated Feb. 21, 2017 from the Japanese Patent Office in counterpart Application No. 2016-519044.

* cited by examiner

2 μ s/div

| Max | (C1) | 6.25000V | Min | (C1) | 41.6667mV |
| Avg | (C1) | 3.21097V | High | (C1) | 3.20833V |
| Low | (C1) | 3.12500V | Max | (C2) | 7.66667V |
| Min | (C2) | 1.79167V | Avg | (C2) | 5.03811V |
| High | (C2) | 5.04167V | Low | (C2) | 3.12500V |

500ns/div

Max (C1) 5.79167V   Low (C1) 3.20833V   High (C2) 5.16667V
Min (C1) 708.333mV  Max (C2) 7.12500V   Low (C2) 5.04167V
Avg (C1) 3.20707V   Min (C2) 3.04167V
High (C1) 3.29167V  Avg (C2) 5.03522V

GROUND STRUCTURE FOR CONTROL UNIT

CROSS REFERENCE TO RELATED APPLICATIONS

This application is a National Stage of International Application No. PCT/JP2014/062885 filed May 14, 2014, the contents of all which are incorporated herein reference in their entirety.

FIELD

The present invention relates to a ground structure of a control unit.

BACKGROUND

Conventionally, as a ground structure of a circuit, the following structure is known.

Patent Literature 1 discloses a noise suppressing circuit structure. A noise suppressing circuit unit thereof includes a power supply unit, a noise filter unit, and a terminal unit. The terminal unit includes a power-supply line terminal, an external frame ground terminal, a signal ground terminal, and an internal frame ground terminal. Housings of respective units are connected to each other with sheets of metal. Further, an output terminal of a ground potential of the power supply unit and the signal ground terminal of the terminal unit are connected to each other via a cable. Further, a ground terminal of the noise filter unit and the internal frame ground terminal of the terminal unit are connected to each other.

Patent Literature 2 discloses a connection method for a control board using a high frequency signal of equal to or higher than 1 MHz and a low frequency signal. According to this technique, a signal ground is connected to a frame ground at a single point. Along with this connection, the signal ground is connected to the frame ground at multiple points via a capacitor.

CITATION LIST

Patent Literatures

Patent Literature 1: Japanese Patent Application Laid-open No. H11-355091
Patent Literature 2: Japanese Patent Application Laid-open No. H5-102676

SUMMARY

Technical Problem

A control unit that controls a control target such as an industrial robot includes a power supply board that generates a control voltage and a control board that controls the control target based on the control voltage. In a case of an industrial robot, the control unit sometimes includes a driving board. In such a control unit, there is a possibility that noise on the power supply board causes negative influences on the control voltage on the control board. In order to realize highly reliable control by preventing erroneous operations of the control board, it is desired to reduce negative influences of noise on the control voltage.

An object of the present invention is to provide a technique by which, in a control unit, negative influences of noise on a control voltage can be reduced.

Solution to Problem

According to an aspect of the present invention, a control unit is provided. The control unit includes: a power supply board on which a control power-supply circuit that generates a control voltage is mounted; a control board on which a control circuit that is operated based on the control voltage is mounted; and a connection medium that connects the power supply board and the control board to each other and is used to supply the control voltage from the control power-supply circuit to the control circuit. A signal ground of the control power-supply circuit and a signal ground of the control circuit are connected to each other via a frame ground without via the connection medium.

Advantageous Effects of Invention

According to the present invention, in the control unit, negative influences of noise on a control voltage can be reduced. As a result, the operation reliability of the control unit is improved.

DESCRIPTION OF EMBODIMENTS

Exemplary embodiments of the present invention will be explained with reference to the accompanying drawings.

First Embodiment

Figure 1:
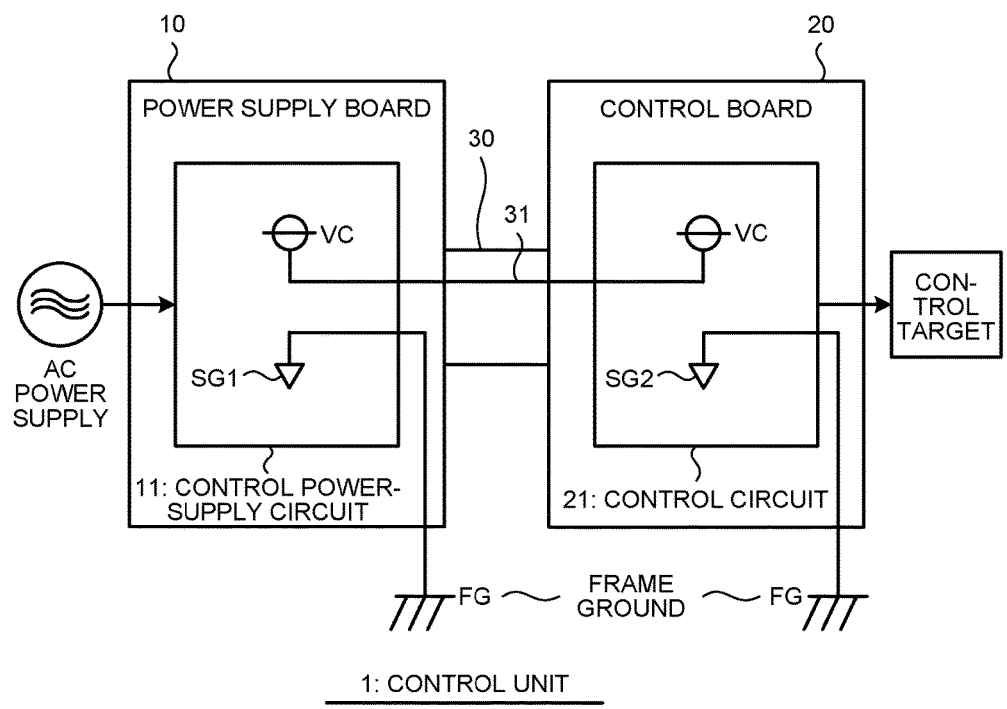
FIG. 1 is a block diagram schematically illustrating a configuration example of a control unit according to a first embodiment of the present invention.

FIG. 1 is a block diagram schematically illustrating a configuration example of a control unit 1 according to a first embodiment of the present invention. The control unit 1 includes a power supply board 10, a control board 20, and a connection medium 30.

The power supply board 10 is a circuit board that generates a control voltage VC to be used by the control board 20. More specifically, a control power-supply circuit 11 that generates a control voltage VC is mounted on the power supply board 10. For example, the control power-supply circuit 11 converts an alternating-current voltage supplied from an external alternating-current power supply into a direct-current control voltage VC.

The control board 20 is a circuit board that controls a control target. More specifically, a control circuit 21 that controls a control target is mounted on the control board 20. The control circuit 21 is operated based on the control voltage VC generated by the control power-supply circuit 11 and controls the control target. A CPU is exemplified as the control circuit 21.

The connection medium 30 is a medium (such as a cable or a connector) that connects the power supply board 10 and the control board 20. The connection medium 30 is used for supplying the control voltage VC from the control power-supply circuit 11 to the control circuit 21. More specifically, the connection medium 30 includes a power-supply signal line 31 that transfers the control voltage VC from the control power-supply circuit 11 to the control circuit 21.

Next, a ground structure of the control unit 1 according to the first embodiment is described.

A signal ground SG1 of the control power-supply circuit 11 of the power supply board 10 is electrically connected to a frame ground FG provided outside of the power supply board 10. Further, a signal ground SG2 of the control circuit 21 of the control board 20 is electrically connected to the frame ground FG. Therefore, the signal ground SG1 of the control power-supply circuit 11 and the signal ground SG2 of the control circuit 21 are electrically connected to each other via the frame ground FG. Meanwhile, the connection medium 30 described above is not used for connection of the signal ground SG1 and the signal ground SG2. That is, according to the first embodiment, the signal ground SG1 of the control power-supply circuit 11 and the signal ground SG2 of the control circuit 21 are connected to each other via the frame ground FG without via the connection medium 30.

Figure 2:
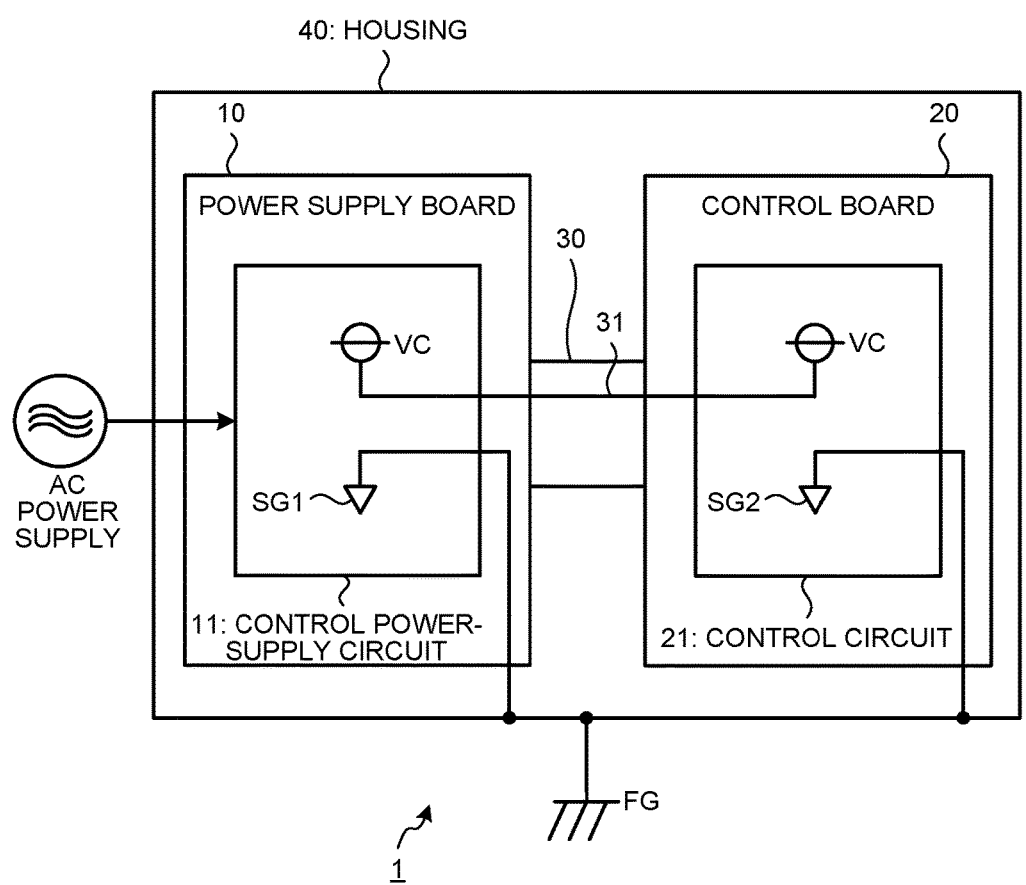
FIG. 2 is a block diagram illustrating another configuration example of the control unit according to the first embodiment of the present invention.

Typically, as illustrated in FIG. 2, the control unit 1 includes a housing 40 in which the power supply board 10, the control board 20, and the connection medium 30 are accommodated. The housing 40 is a frame ground body that is connected to the frame ground FG. Further, the signal ground SG1 of the control power-supply circuit 11 is electrically connected to the housing 40. Preferably, the signal ground SG1 is connected to the housing 40 at a single point. For example, the signal ground SG1 is fixed to the housing 40 with a screw or the like. Similarly, the signal ground SG2 of the control circuit 21 is electrically connected to the housing 40. Preferably, the signal ground SG2 is connected to the housing 40 at a single point. For example, the signal ground SG2 is fixed to the housing 40 with a screw or the like.

Figure 3:
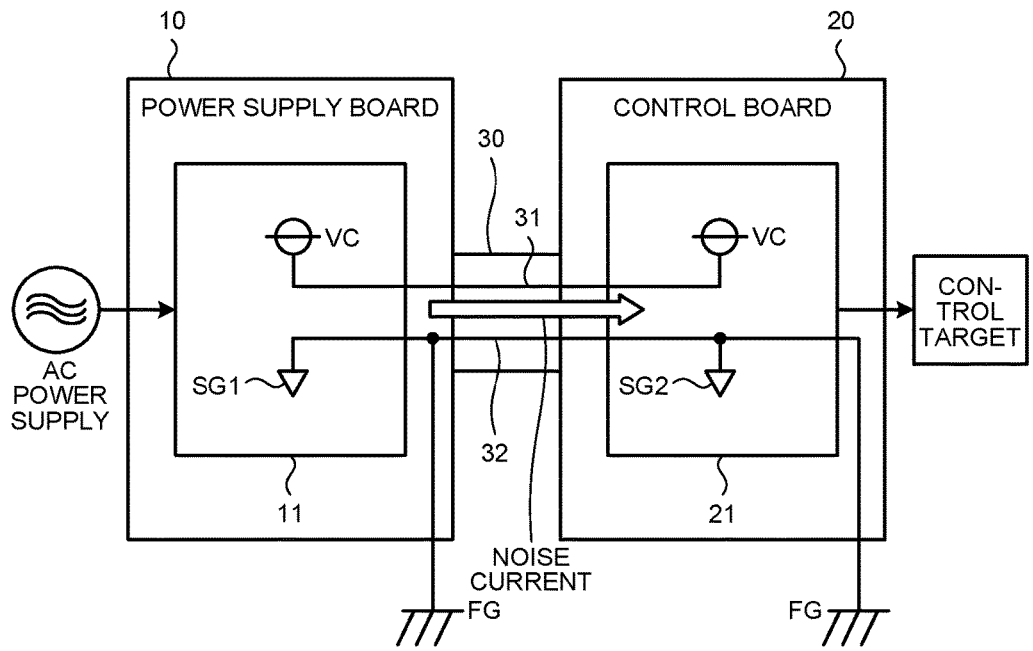
FIG. 3 is a block diagram schematically illustrating a comparative example.

FIG. 3 is a block diagram schematically illustrating a comparative example. In the comparative example, the signal ground SG1 of the control power-supply circuit 11 and the signal ground SG2 of the control circuit 21 are connected to each other via the connection medium 30. That is, the connection medium 30 includes a ground signal line 32 that connects the signal ground SG1 and the signal ground SG2 to each other.

In the case of the comparative example, noise mixed into the signal ground SG1 in the power supply board 10 passes through the connection medium 30 (the ground signal line 32) and the signal ground SG2 and propagates to the control board 20. That is, the noise on the power supply board 10 passes through the connection medium 30 and flows into the control board 20. The noise flown-in in this manner causes negative influences on the control voltage VC in the control board 20.

On the other hand, according to the first embodiment, the signal ground SG1 of the control power-supply circuit 11 and the signal ground SG2 of the control circuit 21 are connected to each other via the frame ground FG without via the connection medium 30. Therefore, there is no possibility that the noise mixed into the signal ground SG1 in the power supply board 10 passes through the connection medium 30 and the signal ground SG2 and propagates to the control board 20.

Instead, the noise mixed into the signal ground SG1 in the power supply board 10 is discharged onto the frame ground FG and is absorbed into the frame ground FG. For example, the noise is absorbed into a frame ground (not illustrated) of a distribution board from the housing 40 through a power-supply frame ground line. Because the impedance from the frame ground FG to the signal ground SG2 of the control board 20 is higher than the impedance from the frame ground FG to the frame ground of the distribution board, the noise is hardly transferred from the frame ground FG to the signal ground SG2.

It can be said that the present inventor is the first person to have found that the noise elimination effect obtained by causing the noise to be absorbed into the frame ground FG exceeds the shortcomings due to omitting the ground signal line 32.

As described above, according to the control unit 1 of the first embodiment, noise on the power supply board 10 is suppressed from flowing into the control board 20 through the connection medium 30. Therefore, negative influences of noise on the control voltage VC used in the control board 20 are reduced. As a result, the operation reliability of the control unit 1 is improved.

Second Embodiment

Figure 4:
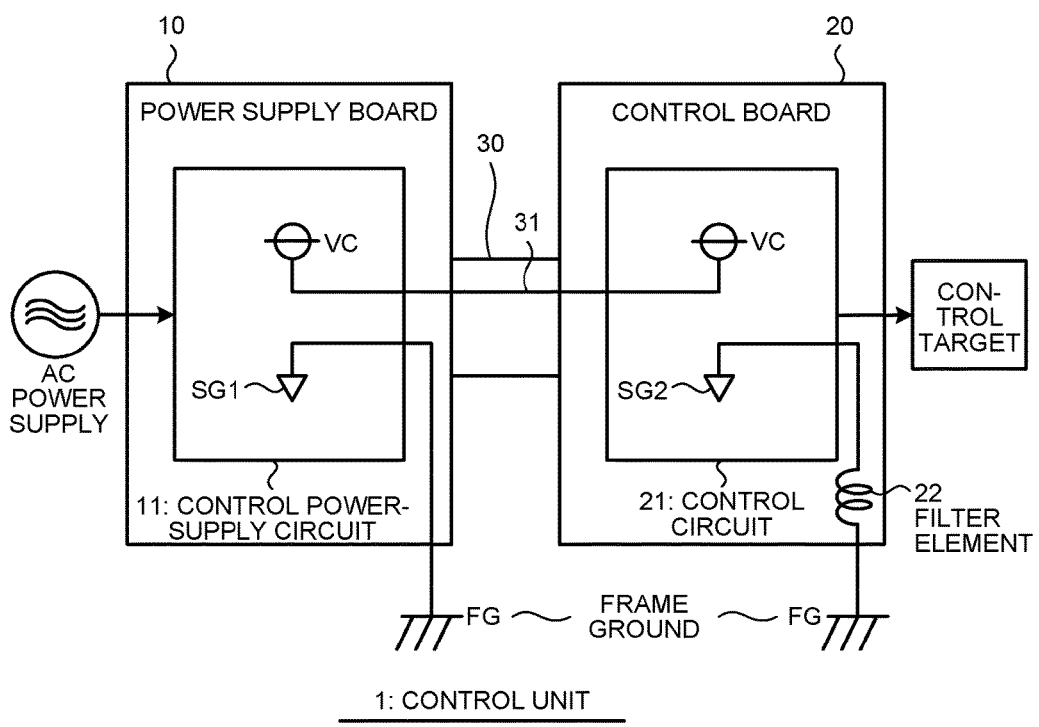
FIG. 4 is a block diagram schematically illustrating a configuration example of a control unit according to a second embodiment of the present invention.

FIG. 4 is a block diagram schematically illustrating a configuration example of the control unit 1 according to a second embodiment of the present invention. Descriptions redundant to those of the first embodiment are omitted as appropriate.

According to the second embodiment, the signal ground SG2 of the control circuit 21 is connected to the frame ground FG via a filter element 22. For example, the filter element 22 is provided on the control board 20. For example, an inductor may be used as the filter element 22. Alternatively, as the filter element 22, it is possible to employ a minute resistance that is minute enough to regard that the signal ground SG2 and the frame ground FG are identical to each other.

Figure 5:
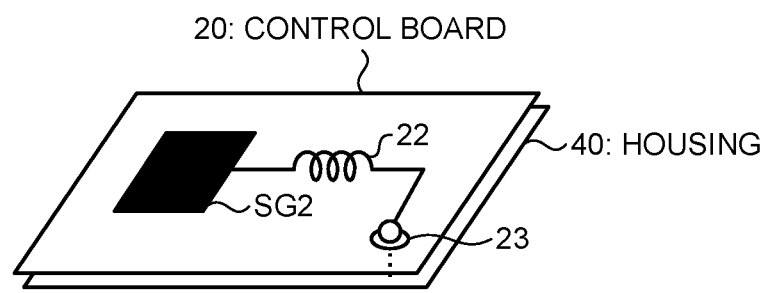
FIG. 5 is a schematic diagram illustrating a configuration example of a control board of the control unit according to the second embodiment of the present invention.

FIG. 5 is a schematic diagram illustrating a configuration example of the control board 20 according to the second embodiment. A pattern of the signal ground SG2 and the filter element 22 are formed on the control board 20. One end of the filter element 22 is connected to the pattern of the signal ground SG2, and the other end of the filter element 22 is connected to the housing 40 (the frame ground body) by a screw 23.

As described above, according to the second embodiment, the signal ground SG2 is connected to the frame ground FG via the filter element 22. Due to this configuration, the noise flowing into the signal ground SG2 from the frame ground FG is further reduced. That is, negative influences of noise on the control voltage VC used in the control board 20 are further reduced and thus this configuration is preferable.

Third Embodiment

Figure 6:
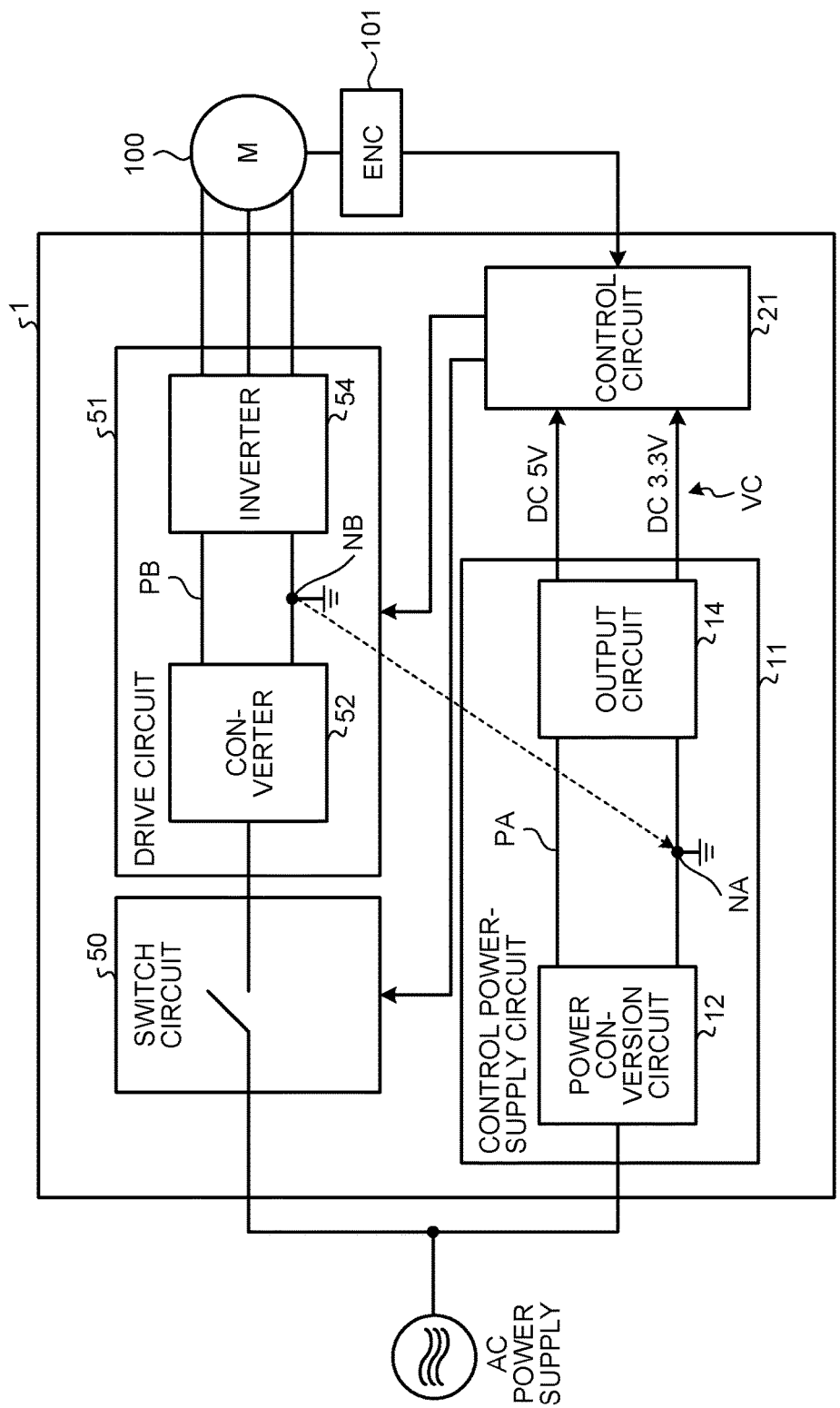
FIG. 6 is a block diagram schematically illustrating a configuration example of a control unit according to a third embodiment of the present invention.

FIG. 6 is a block diagram schematically illustrating a configuration example of the control unit 1 according to a third embodiment of the present invention. In the third embodiment, as an application example, a case where the control unit 1 is applied as a servo amplifier is described. Descriptions that duplicate those of the first embodiment are omitted as appropriate.

The control unit 1 as a servo amplifier executes drive control of a servo motor 100. Specifically, the control unit 1 includes a switch circuit 50 and a drive circuit 51 in addition to the control power-supply circuit 11 and the control circuit 21 described above.

The control power-supply circuit 11 converts an alternating-current voltage supplied from an external alternating-current power supply into a direct-current control voltage VC. More specifically, the control power-supply circuit 11 includes a power conversion circuit 12 (an internal power supply) and an output circuit 14. An input of the power conversion circuit 12 is connected to the external alternating-current power supply, and an output of the power conversion circuit 12 is connected to a P-side power line PA and an N-side power line NA. The N-side power line NA is grounded. The power conversion circuit 12 converts an alternating-current voltage supplied from the external alternating-current power supply into a direct-current voltage. The output circuit 14 outputs a control voltage VC based on the direct-current voltage. In this example, two types of voltages, which are DC 5V and DC 3.3V, are used as the control voltage VC.

The control circuit 21 is operated based on the control voltage VC generated by the control power-supply circuit 11. Specifically, the control circuit 21 controls operations of the switch circuit 50 and the drive circuit 51 according to an external command (not illustrated). In this control, positional information detected by an encoder 101 that is attached to the servo motor 100 may be used.

The switch circuit 50 is provided between the external alternating-current power supply and the drive circuit 51. The switch circuit 50 is ON/OFF-controlled by the control circuit 21 such that supply of an alternating-current voltage (an alternating current) from the external alternating-current power supply to the drive circuit 51 is turned ON and OFF. The switch circuit 50 is a relay, for example.

The drive circuit 51 drives the servo motor 100 as a load according to the control executed by the control circuit 21. More specifically, the drive circuit 51 includes a converter 52 and an inverter 54. An input of the converter 52 is connected to the switch circuit 50, and an output of the converter 52 is connected to a P-side power line PB and an N-side power line NB. The N-side power line NB is grounded. The converter 52 converts an alternating-current voltage supplied via the switch circuit 50 into a direct-current voltage. The inverter 54 converts the direct-current voltage into an alternating-current voltage and outputs the converted voltage to the servo motor 100.

In this configuration, noise is generated, for example, at the time of switching (switching ON and OFF) of the switch circuit 50. There is a possibility that the generated noise is transferred from the N-side power line NB of the drive circuit 51 to the N-side power line NA of the control power-supply circuit 11 thereby causing negative influences on the control voltage VC. It is conceivable to apply the present invention in order to suppress such negative influences of noise on the control voltage VC in the control circuit 21.

Figure 7:
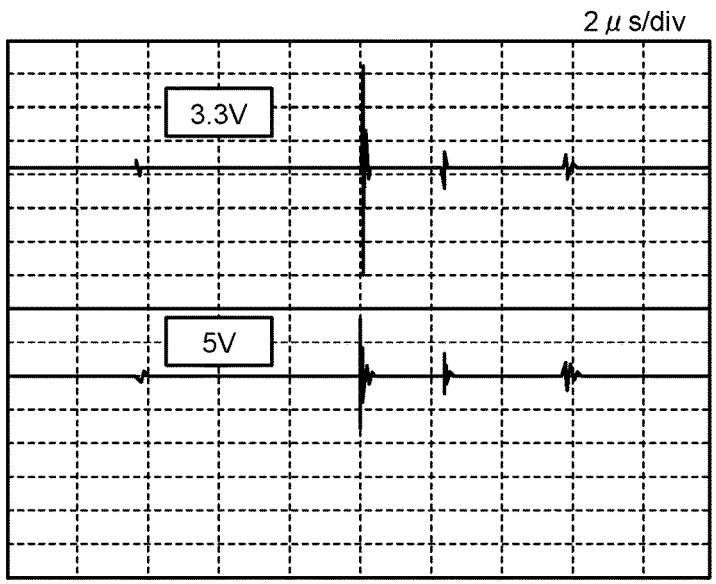
FIG. 7 is a graph for explaining an effect of the present invention.
Figure 8:
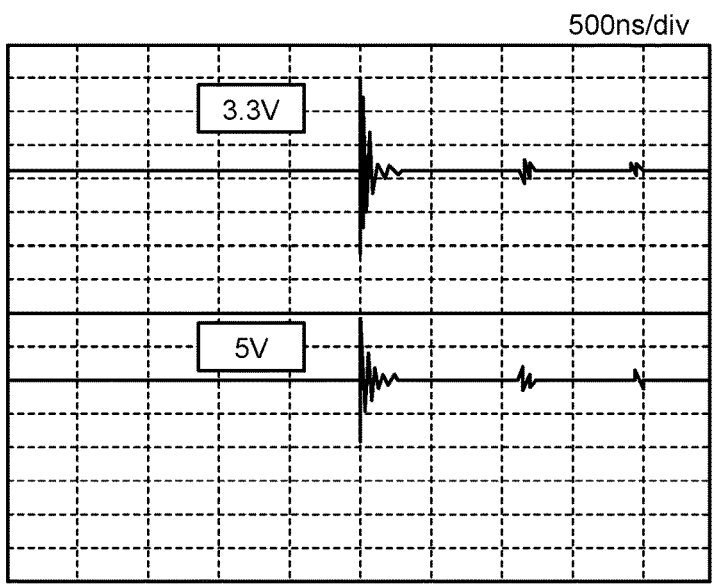
FIG. 8 is a graph for explaining an effect of the present invention.

FIGS. 7 and 8 are graphs for explaining an effect obtained by application of the present invention. More specifically, FIGS. 7 and 8 illustrate noise generated in the control voltage VC in the control circuit 21 at the time of switching the switch circuit 50 from OFF to ON. FIG. 7 illustrates a case of the comparative example described above and illustrated in FIG. 3, where the signal ground SG1 and the signal ground SG2 are connected to each other via the connection medium 30 (the ground signal line 32). Meanwhile, FIG. 8 illustrates a case of applying the present invention.

In FIGS. 7 and 8, the vertical axis represents the control voltage VC in the control circuit 21, and the horizontal axis represents a time. While the scale of the vertical axis is 1 V/div being common in FIGS. 7 and 8, note that the scale of the horizontal axis is different in FIGS. 7 and 8 (2 μs/div in FIG. 7 and 500 ns/div in FIG. 8).

Further, DC 3.3V (C1) and DC 5V (C2) are both illustrated in each of FIGS. 7 and 8.

In the comparative example illustrated in FIG. 7, the amplitude of noise at the time of ON-switching is as follows. At DC 3.3V (C1), the maximum value and the minimum value of the noise voltage are 6.25V and 0.04V, respectively. At DC 5V (C2), the maximum value and the minimum value of the noise voltage are 7.67V and 1.79V, respectively.

Meanwhile, in the case of the present invention illustrated in FIG. 8, the amplitude of noise at the time of ON-switching is as follows. At DC 3.3V (C1), the maximum value and the minimum value of the noise voltage are 5.79V and 0.7V, respectively. At DC 5V (C2), the maximum value and the minimum value of the noise voltage are 7.12V and 3.04V, respectively.

In this manner, it is understood that by applying the present invention, the amplitude of noise generated in the control voltage VC is decreased.

Embodiments of the present invention have been described above with reference to the accompanying drawings. The present invention is not limited to the above embodiments and can be modified as appropriate by persons skilled in the art without departing from the scope of the invention.

REFERENCE SIGNS LIST 1 control unit, 10 power supply board, 11 control power-supply circuit, 12 power conversion circuit, 14 output circuit, 20 control board, 21 control circuit, 22 filter element, 23 screw, 30 connection medium, 31 power-supply signal line, 32 ground signal line, 40 housing, 50 switch circuit, 51 drive circuit, 52 converter, 54 inverter, 100 servo motor, 101 encoder, FG frame ground, SG1 signal ground, SG2 signal ground, VC control voltage.

The invention claimed is:

1. A controller comprising:
    a power supply board on which a control power-supply circuit that generates a control voltage is mounted;
    a control board on which a control circuit that is operated based on the control voltage is mounted; and
    a wiring that connects the power supply board and the control board to each other and is used to supply the control voltage from the control power-supply circuit to the control circuit, wherein
    a signal ground of the control power-supply circuit and a signal ground of the control circuit are connected to each other via a frame ground without via the wiring.

2. The controller according to claim 1, further comprising a housing in which the power supply board, the control board, and the wiring are accommodated, wherein
    the housing is connected to the frame ground, and
    the signal ground of the control power-supply circuit and the signal ground of the control circuit are connected to the housing.

3. The controller according to claim 1, wherein the signal ground of the control circuit is connected to the frame ground via a filter element.

4. The controller according to claim 1, wherein
the control voltage is a direct-current voltage, and
the control power-supply circuit includes a power conversion circuit that converts an alternating-current voltage supplied from an external alternating-current power supply into a direct-current voltage.

5. The controller according to claim 4, further comprising:
a drive circuit that drives a load according to control executed by the control circuit; and
a switch circuit that turns ON and OFF of supply of the alternating-current voltage to the drive circuit, wherein
the drive circuit includes a converter that converts the alternating-current voltage into a direct-current voltage.

* * * * *